(12) United States Patent
Ramachandran et al.

(10) Patent No.: US 9,355,904 B2
(45) Date of Patent: May 31, 2016

(54) METHOD FOR STRAIN-RELIEVED THROUGH SUBSTRATE VIAS

(71) Applicant: QUALCOMM Incorporated, San Diego, CA (US)

(72) Inventors: Vidhya Ramachandran, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/311,405

(22) Filed: Jun. 23, 2014

(65) Prior Publication Data

US 2014/0302674 A1    Oct. 9, 2014

Related U.S. Application Data

(62) Division of application No. 13/405,600, filed on Feb. 27, 2012, now Pat. No. 8,779,559.

(51) Int. Cl.
| H01L 21/768 | (2006.01) |
| H01L 23/48 | (2006.01) |

(52) U.S. Cl.
CPC .... *H01L 21/76898* (2013.01); *H01L 21/76831* (2013.01); *H01L 23/481* (2013.01); *H01L 21/7682* (2013.01); *H01L 2225/06541* (2013.01); *H01L 2924/0002* (2013.01)

(58) Field of Classification Search
CPC ............ H01L 23/481; H01L 21/76898; H01L 2225/06541
USPC .................................................. 257/621, 531
See application file for complete search history.

(56) References Cited

U.S. PATENT DOCUMENTS

| 2009/0047781 A1 | 2/2009 | Pratt et al. |
| 2009/0243047 A1 | 10/2009 | Wolter et al. |
| 2009/0321796 A1 | 12/2009 | Inohara |
| 2012/0013022 A1 | 1/2012 | Sabuncuoglu et al. |
| 2013/0157436 A1* | 6/2013 | Hummler ...................... 438/424 |
| 2013/0161796 A1 | 6/2013 | Huang et al. |
| 2013/0221494 A1 | 8/2013 | Ramachandran et al. |

FOREIGN PATENT DOCUMENTS

| CN | 1996565 A | 7/2007 |
| CN | 101199049 A | 6/2008 |
| CN | 101771018 A | 7/2010 |
| DE | 10205026 C1 | 5/2003 |
| JP | 2003163266 A | 6/2003 |
| JP | 2009135193 A | 6/2009 |
| JP | 2010135348 A | 6/2010 |
| KR | 20100010324 A | 2/2010 |
| WO | 2012013162 A1 | 2/2012 |

OTHER PUBLICATIONS

International Search Report and Written Opinion—PCT/US2013/027729—ISA/EPO—Jun. 27, 2013.

\* cited by examiner

*Primary Examiner* — Howard Weiss
*Assistant Examiner* — Tifney Skyles
(74) *Attorney, Agent, or Firm* — Michelle S. Gallardo

(57) ABSTRACT

A semiconductor die including strain relief for through substrate vias (TSVs). A method for strain relief of TSVs includes defining a through substrate via cavity in a substrate. The method also includes depositing an isolation layer in the cavity. The method further includes filling the cavity with a conductive material. The method also includes removing a portion of the isolation layer to create a recessed portion.

18 Claims, 19 Drawing Sheets

METHOD FOR STRAIN-RELIEVED THROUGH SUBSTRATE VIAS

CROSS-REFERENCE TO RELATED APPLICATION

This application is a divisional of co-pending U.S. patent application Ser. No. 13/405,600, filed on Feb. 27, 2012, entitled "Structure and Method for Strain-Relieved TSV," the disclosure of which is expressly incorporated by reference herein in its entirety.

TECHNICAL FIELD

The present disclosure generally relates to integrated circuits (ICs). More specifically, the present disclosure relates to strain relief for through substrate vias (TSVs).

BACKGROUND

When a TSV (through substrate via) is filled with a material that has a coefficient of thermal expansion (CTE) mismatch relative to its substrate (e.g., silicon), the TSV incurs high compressive stress. In particular, the compressive stress may be transmitted through the surrounding substrate to neighboring devices. The transferred compressive stress may cause a shift in the parameters of the devices that surround the TSV.

Conventional techniques for addressing compressive stress include a "Keep-Out Region" surrounding the TSV. The Keep-Out Region defines an area surrounding the TSV in which sensitive devices cannot be placed. Unfortunately, a Keep-Out Region results in a circuit layout area penalty. For example, a Keep-Out Region can be as large as five to ten micro-meters (5-10 um) in radius, depending on the particular device sensitivity.

Copper is an example of a filling material that has a CTE mismatch to silicon. When a TSV confined by silicon is thermal cycled, the copper filling material within the TSVs may expand upwardly and out of the TSV. The pumping of the copper upwardly and out of the TSV may disrupt any circuits near the TSV. Although described with reference to copper, the expansion of any filling material that has a CTE mismatch with respect to its substrate, when used to fill a TSV, causes the above-noted problems.

SUMMARY

A method for strain relief of through substrate vias (TSVs) includes defining a through substrate via cavity in a substrate. The method also includes depositing an isolation layer in the cavity. The method further includes filling the cavity with a conductive material. The method also includes removing a portion of the isolation layer to create a recessed portion.

Another method for strain relief of through substrate vias (TSVs) includes the step of defining a through substrate via cavity in a substrate. The method also includes the step of depositing an isolation layer in the cavity. The method further includes the step of filling the cavity with a conductive material. The method also includes the step of removing a portion of the isolation layer to create a recessed portion.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Various aspects of the disclosure provide techniques to mitigate problems relating to the impact of TSV (through substrate via) stress on neighboring devices. According to one aspect of the disclosure, a liner isolation film is described that separates a conductive portion of a through substrate via (TSV) from a substrate (e.g., silicon) layer. In one configuration, a liner isolation layer is recessed around the TSV to a depth in the range of a few microns. In another configuration, the isolation recess void is back-filed with a compliant material. Example compliant materials include, but are not limited to, polyimide and other like compliant materials. In another aspect of the disclosure, following the TSV formation process, back-end of line (BEOL) interconnect layers are fabricated on the wafer to complete an IC device.

Advantageously, the recess opened up between the TSV and the substrate layer allows for strain relief of the TSV and reduces the strain transmitted to the neighboring devices within the substrate. Likewise, by allowing a pathway for the TSV fill material to expand into a recess cavity, filler material pump-out can be reduced. Varying a composition of the liner isolation layer provides different advantages. Back-filling the recess with a compliant material may provide similar advantages with a more robust integration scheme.

Figure 1:
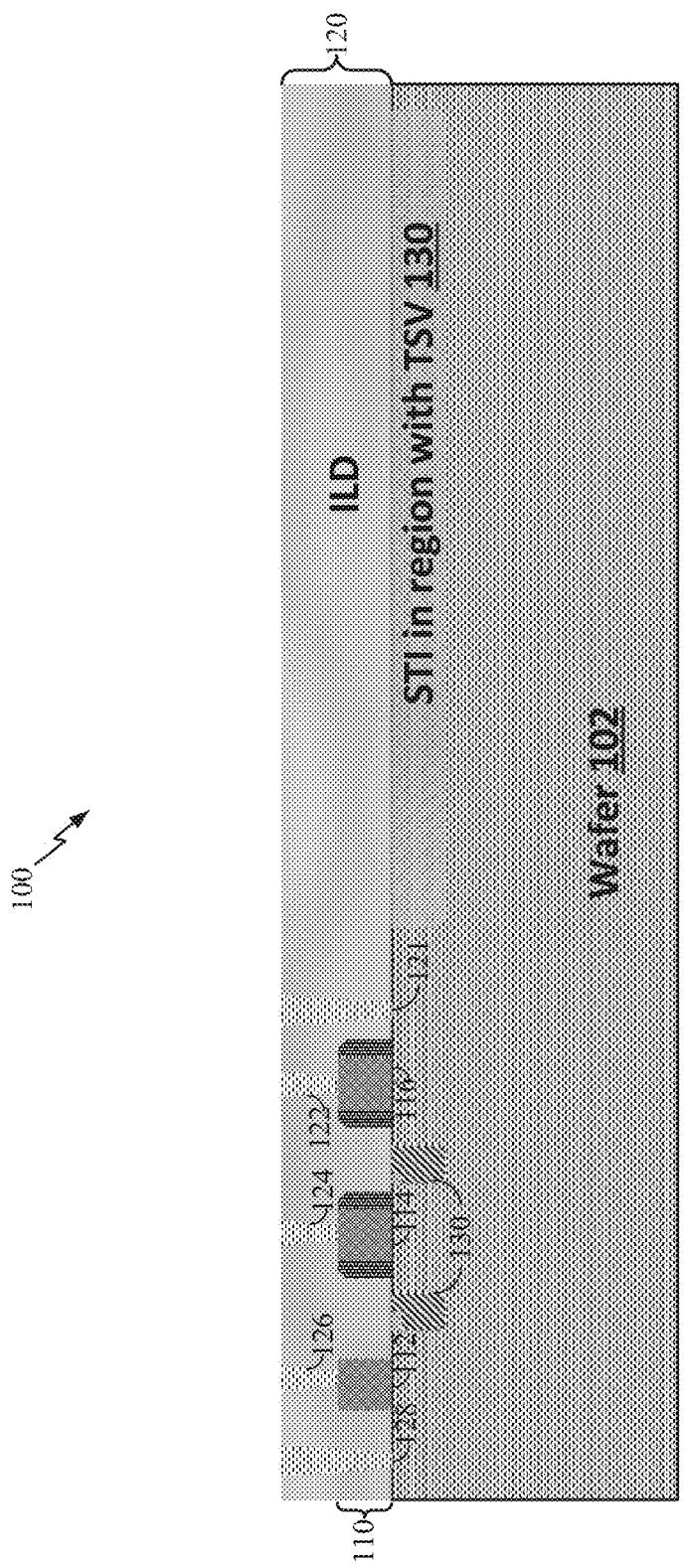
FIG. 1 shows a cross-sectional view illustrating an integrated circuit (IC) device including active devices according to one aspect of the disclosure.

FIG. 1 shows a cross-sectional view illustrating an integrated circuit (IC) device 100 including active devices 112-116 according to one aspect of the disclosure. Representatively, the IC device 100 includes a substrate (e.g., a silicon wafer) 102 including a shallow trench isolation (STI) region 130. In this configuration, the STI region 130 is a semi-metallic or other like material. Above the STI region 130 is an inter-layer dielectric (ILD) layer 120 including a front-end of line (FEOL) interconnect layer 110. The ED layer 120 may include active devices 112-116 and conducive wires (e.g., vias) 121-128. In this configuration, the layer 120 is a contact ILD formed of a silicon oxide or other like material for preventing shorting between the conductive wires 121-128. In an alternative configuration, the ILD layer 120 is a low-K dielectric or other like material. In this arrangement, the IUD layer 120 is on an active portion (e.g., an active surface) of the substrate 102.

Figure 2:
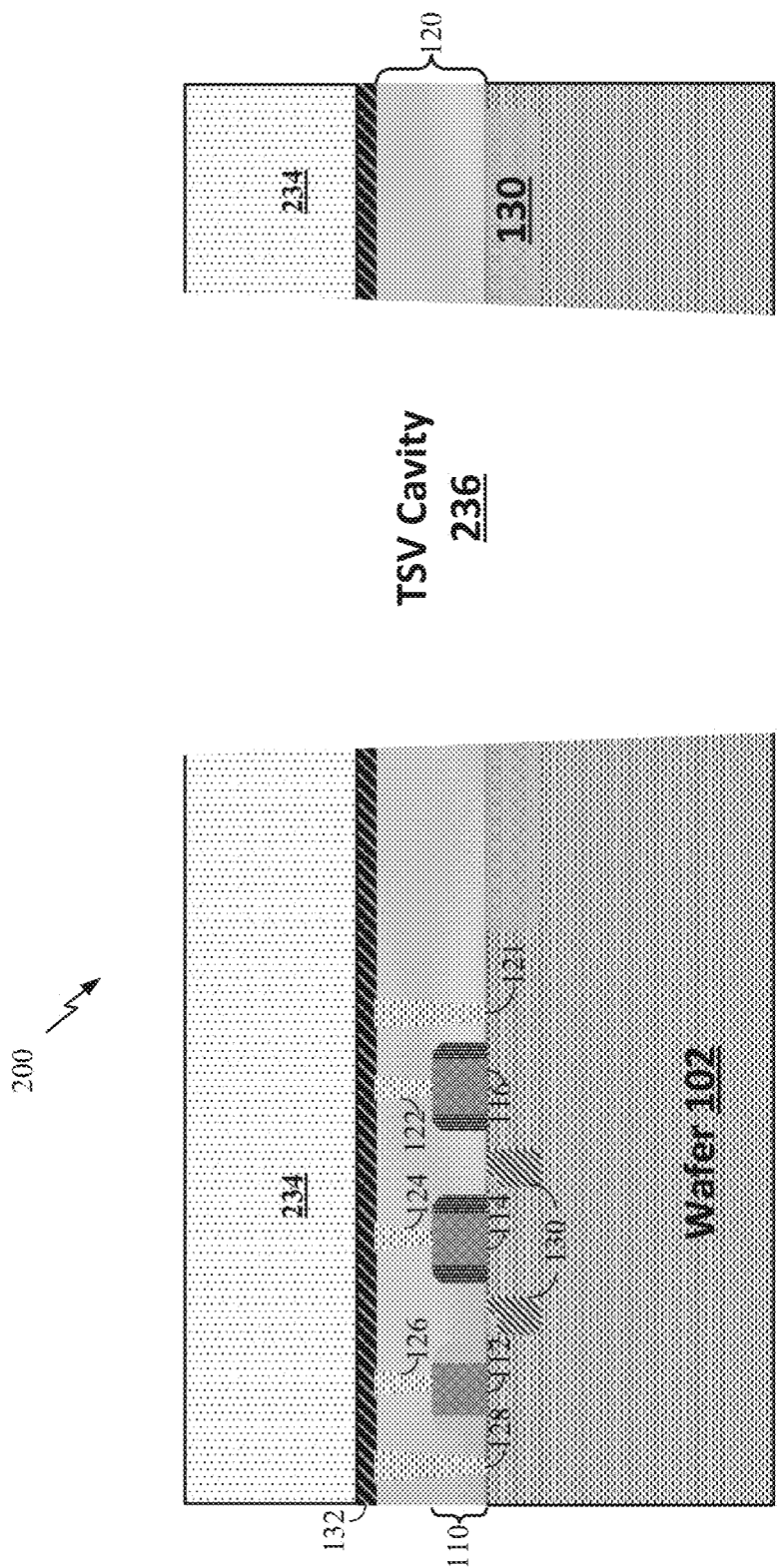
FIG. 2 shows a cross-sectional view illustrating the IC device of FIG. 1, including a photo resist layer to provide an increased size opening for a through substrate via (TSV) according to one aspect of the disclosure.

FIG. 2 shows a cross-sectional view illustrating the IC device 200 of FIG. 1, including a photo resist layer 234 to provide a TSV cavity 236 with an increased size (e.g., fifty microns) for one or more isolation layers and a TSV (through-substrate via) according to one aspect of the disclosure. As shown in FIG. 2, after depositing the polish stop layer 132 on a surface of the ILD layer 120, lithography defines a TSV (through-substrate via) cavity 236 that is slightly larger than an actual, final TSV (see FIGS. 4-8). In this configuration, a size of the TSV is on the order of 0.25-0.5 micro-meters (μm). The polish stop layer 132 may be formed of a silicon carbide, silicon nitride, or other like protective material.

Figure 3:
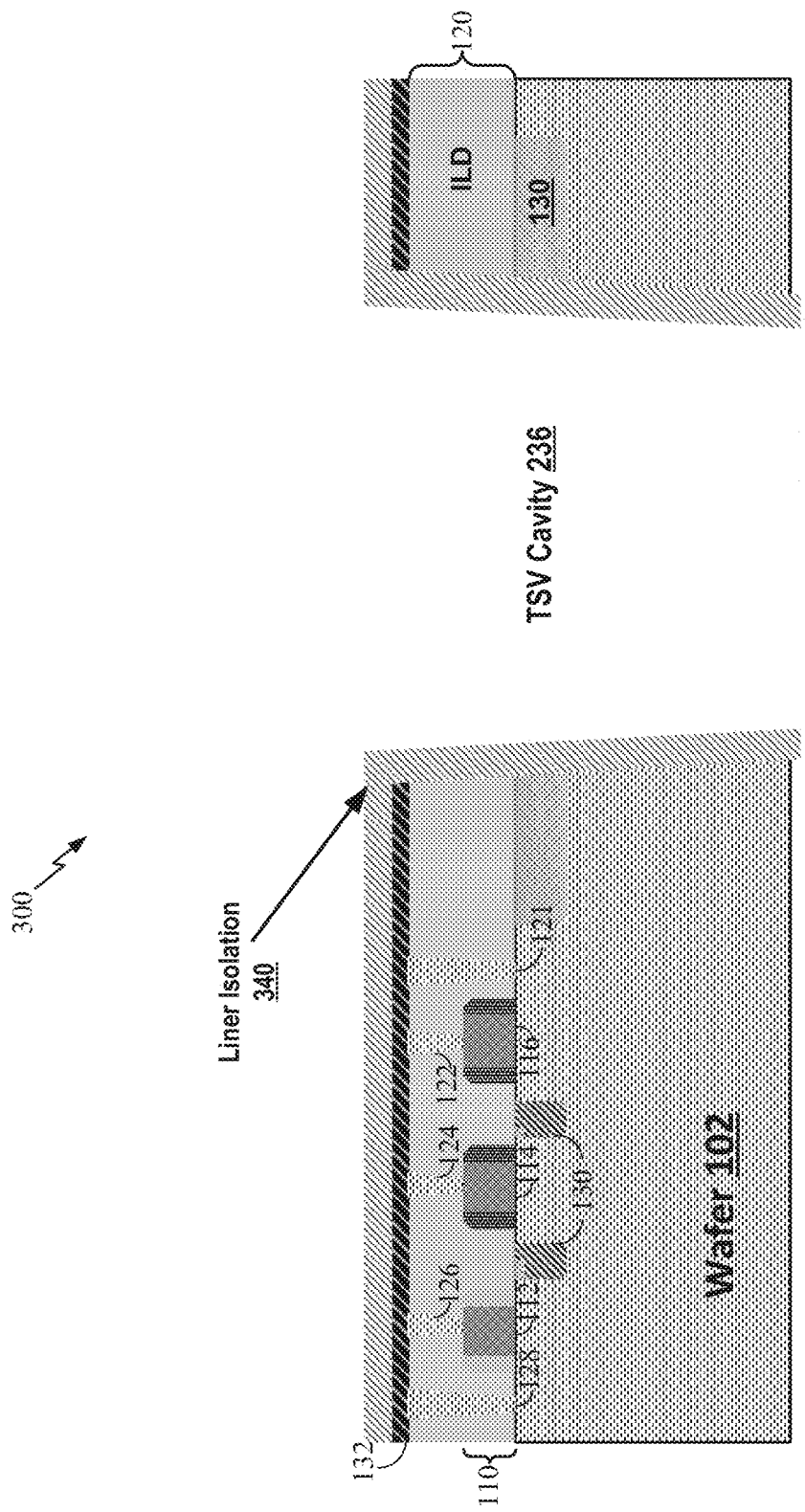
FIG. 3 shows a cross-sectional view illustrating the IC device of FIG. 2, including a liner isolation layer according to one aspect of the disclosure.

FIG. 3 shows a cross-sectional view illustrating the IC device 300 of FIG. 2, with a liner isolation layer 340 according to one aspect of the disclosure. In this configuration, an etch and/or lithographic process etches through the ILD layer 120, the STI region 130, and the silicon wafer 102. After the etch is complete, a liner isolation deposition forms the liner isolation layer 340 onto the polish stop layer 132 and the sidewalls of the TSV cavity 236. The liner isolation layer 340 may be formed with a layer of unfluorinated silica glass (USG), tetraethyl orthosilicate (TEOS), silicon oxide, silicon nitride, or other like precursor for forming an oxide film. The liner isolation layer 340 may also be formed with a layer of organic material such as an organic insulator. The liner isolation layer 340 may have a thickness of one-quarter micron.

Figure 4:
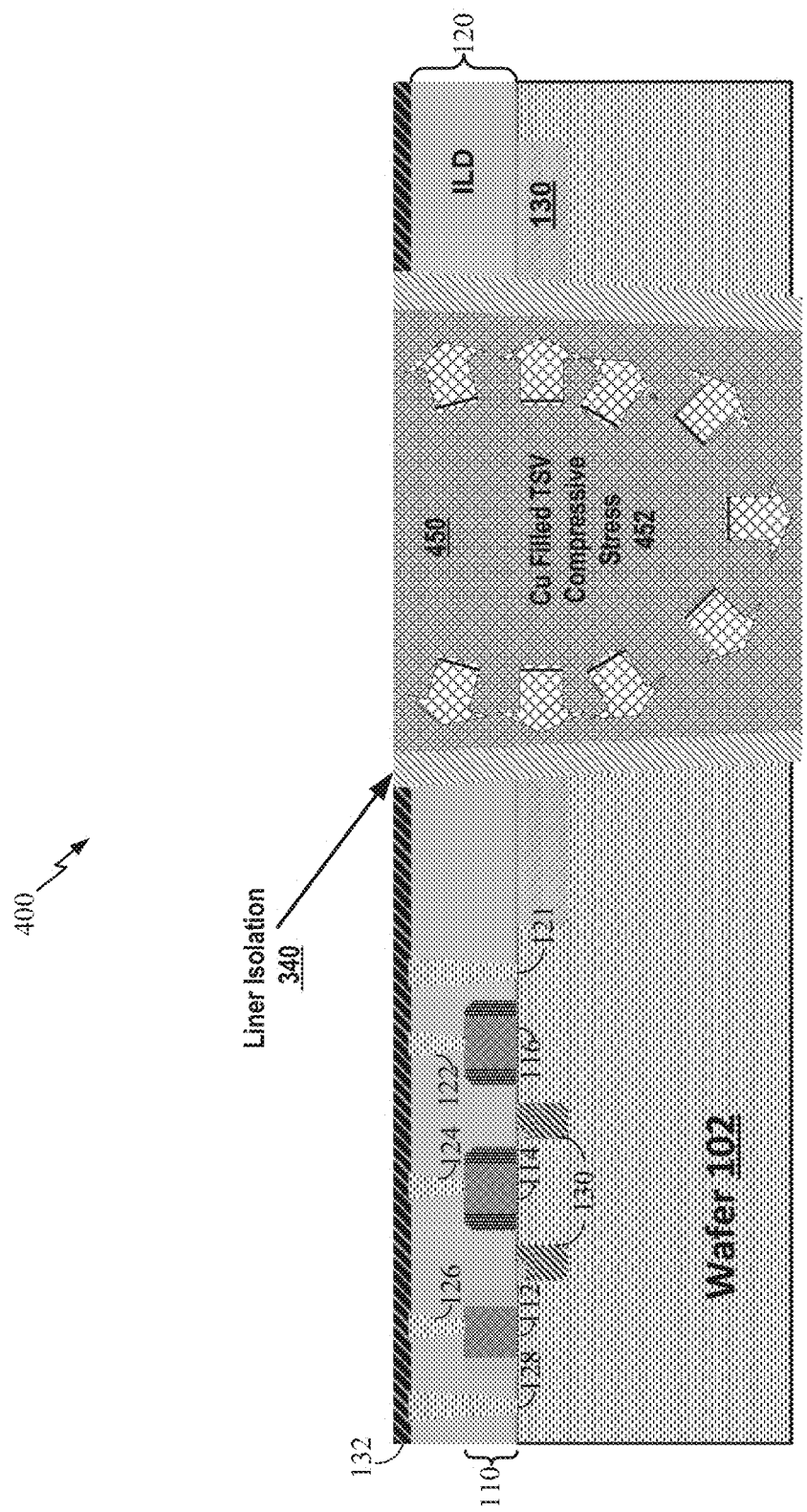
FIG. 4 shows a cross-sectional view of the IC device of FIG. 3, illustrating a through substrate via (TSV) surrounded by the liner isolation layer according to one aspect of the disclosure.

FIG. 4 shows a cross-sectional view illustrating the IC device 400 of FIG. 3, including a through substrate via (TSV) 450 surrounded by the liner isolation layer 340 according to one aspect of the disclosure. As shown in FIG. 4, a TSV fill and polish process is performed to fill the TSV cavity with a filler material for forming the TSV 450, which is surrounded by the liner isolation layer 340. In the illustrated example, the filler material is copper. The liner isolation layer 340 prevents the filler material within the TSV 450 from contacting the silicon wafer 102. The filler material may include, but is not limited to, copper, tungsten, or other like filler material having a coefficient of thermal expansion (CTE) mismatch relative to the substrate material, which in this example is silicon. As shown in FIG. 4, compressive stress 452 may affect the active devices 112-116 within the ILD layer 120, and/or the silicon wafer 102.

Figure 5:
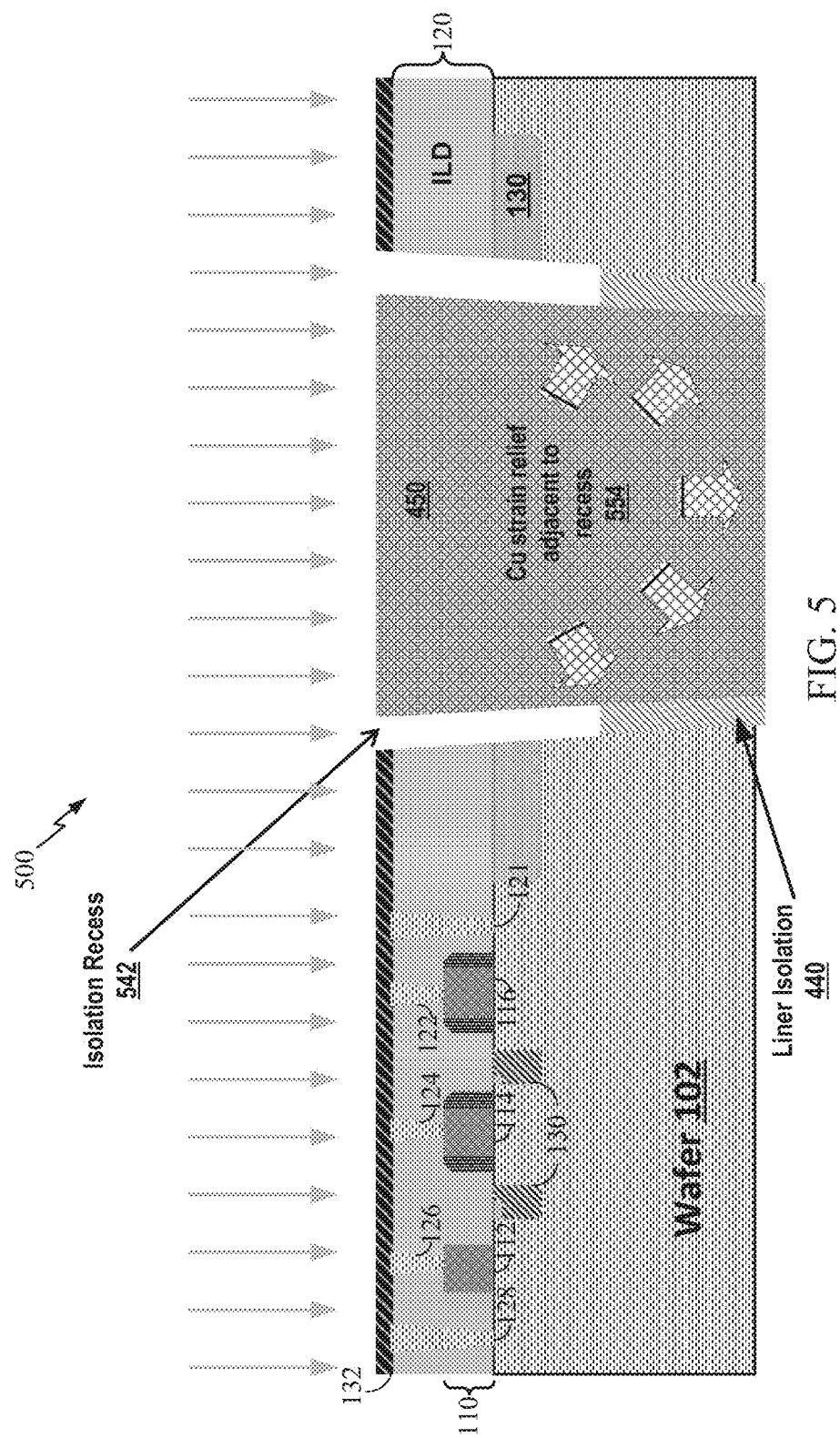
FIG. 5 shows a cross-sectional view illustrating the IC device of FIG. 4, including an isolation recess formed within the liner isolation layer according to one aspect of the disclosure.

FIG. 5 shows a cross-sectional view illustrating the IC device 500 of FIG. 4, including an isolation recess 542 formed within the liner isolation layer 440 according to one aspect of the disclosure. As shown in FIG. 5, a chemically selective etch of the liner isolation layer 440 is performed. Representatively, the chemically selective etch removes the polish stop layer 132 that is over the liner isolation layer 440 and forms the isolation recess 542 to a depth of one to two microns. In one aspect of the disclosure, the depth of the isolation recess is based on how deep the devices (e.g., the active devices 112-116) extend into the silicon wafer 102, which may be determined according to the transistor technology. As shown in FIG. 5, the chemically selective etch process causes the formation of the isolation recess 542 for providing stress relief for the filler material of the TSV 450.

Figure 6:
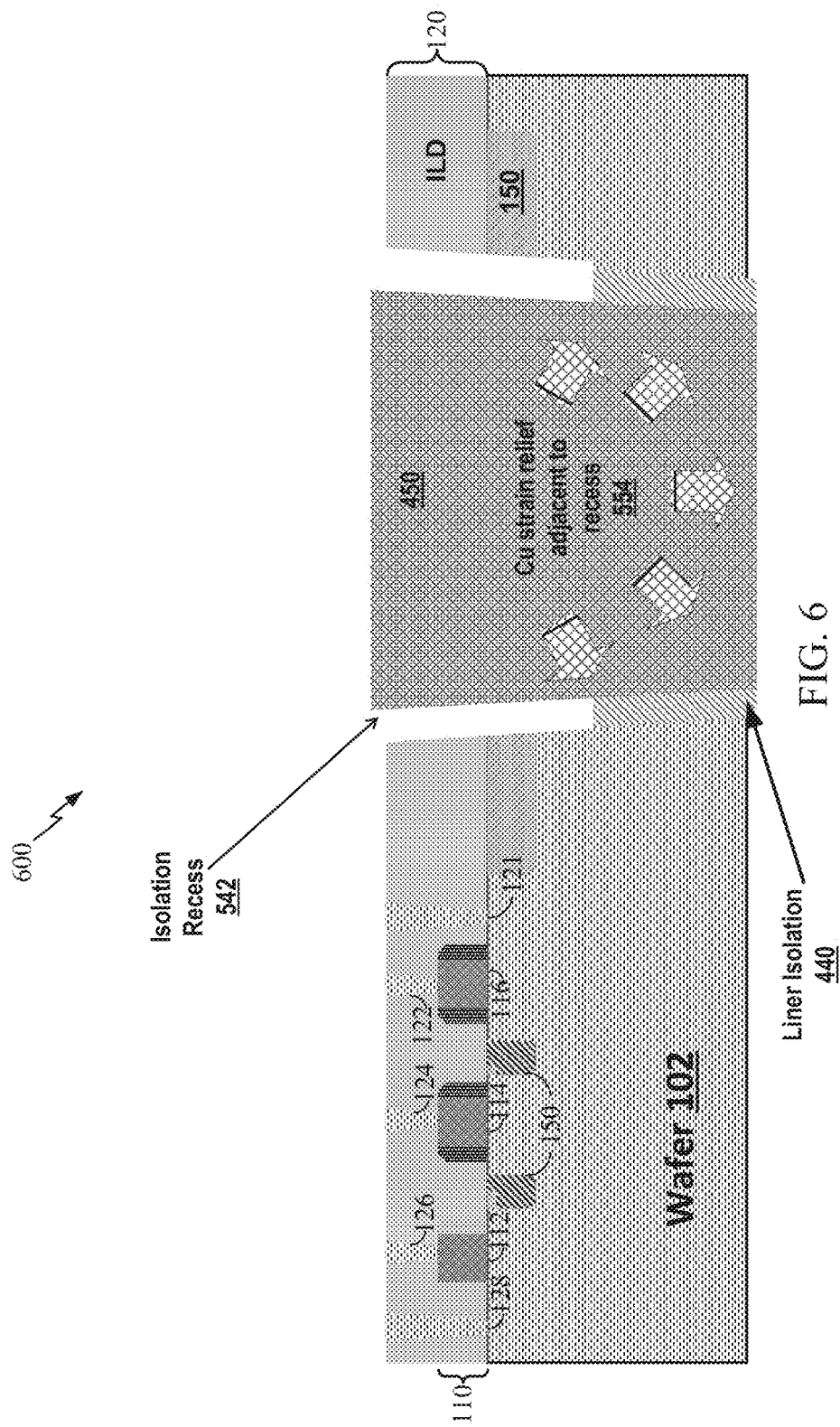
FIG. 6 shows a cross-sectional view illustrating the IC device of FIG. 5, including an isolation recess and the liner isolation layer formed on a sidewall of a TSV cavity according to one aspect of the disclosure.

FIG. 6 shows a cross-sectional view illustrating the IC device 600 of FIG. 5, including an isolation recess 542 and the liner isolation layer 440 formed on a sidewall of the TSV 450 according to one aspect of the disclosure. Representatively, a polish stop removal is performed to remove the polish stop layer 132 in preparation for the formation of a back-end of line interconnect stack, as shown in FIG. 7.

Figure 7:
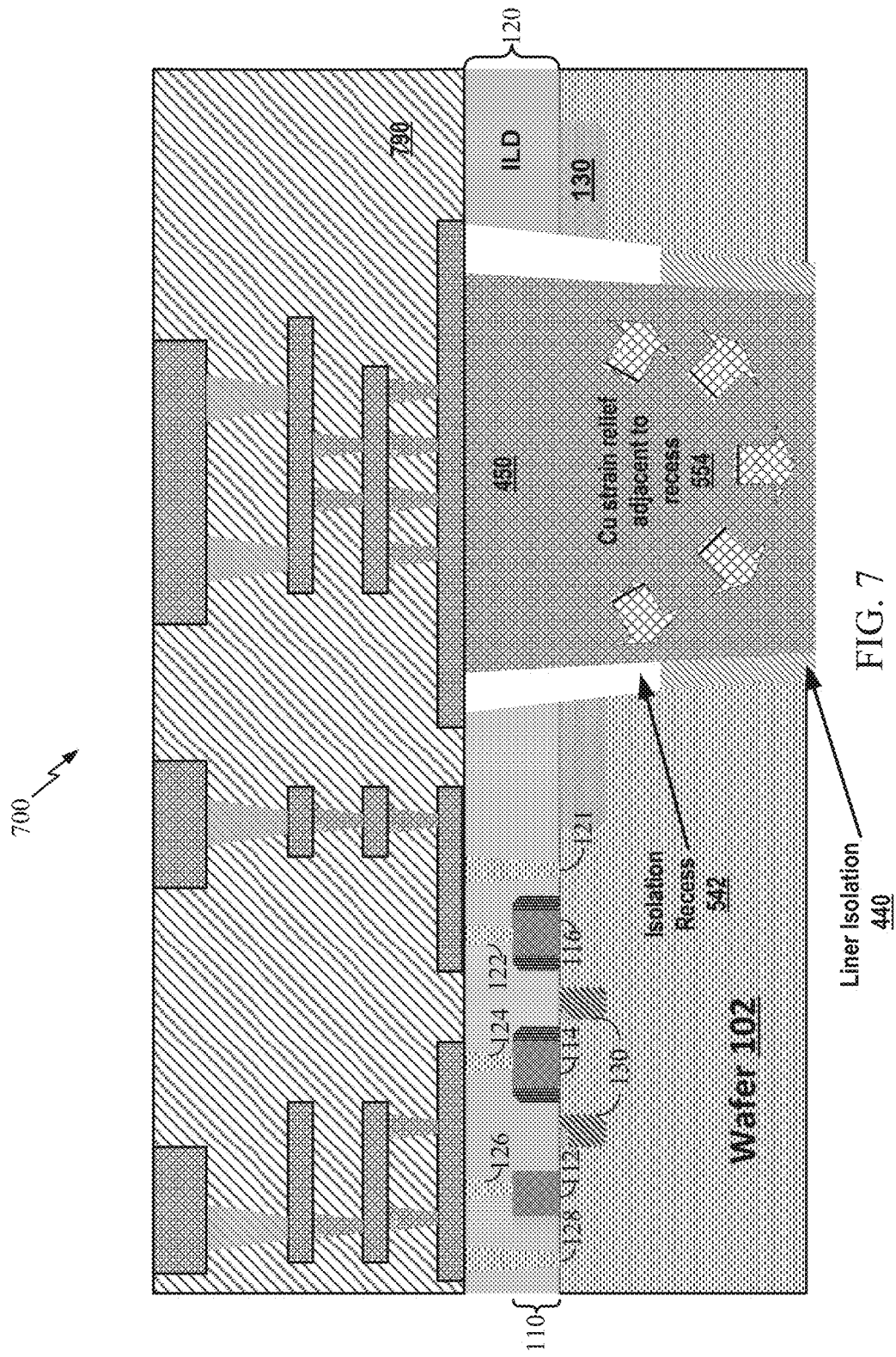
FIG. 7 shows a cross-sectional view illustrating the IC device of FIG. 6, following a back-end of line (BEOL) stack fabrication according to one aspect of the disclosure.

FIG. 7 shows a cross-sectional view illustrating the IC device 700 including of FIG. 6, following a back-end of line (BEOL) stack fabrication according to one aspect of the disclosure. Representatively, after TSV processing is complete, BEOL interconnect layers of the BEOL interconnect stack 790 are fabricated on the wafer 102 to complete the formation of the IC device 700. In this configuration, the isolation recess 542 provides strain relief for the TSV filler material to reduce and/or prevent the filler material from being pumped upwards and out of the TSV.

Figure 8:
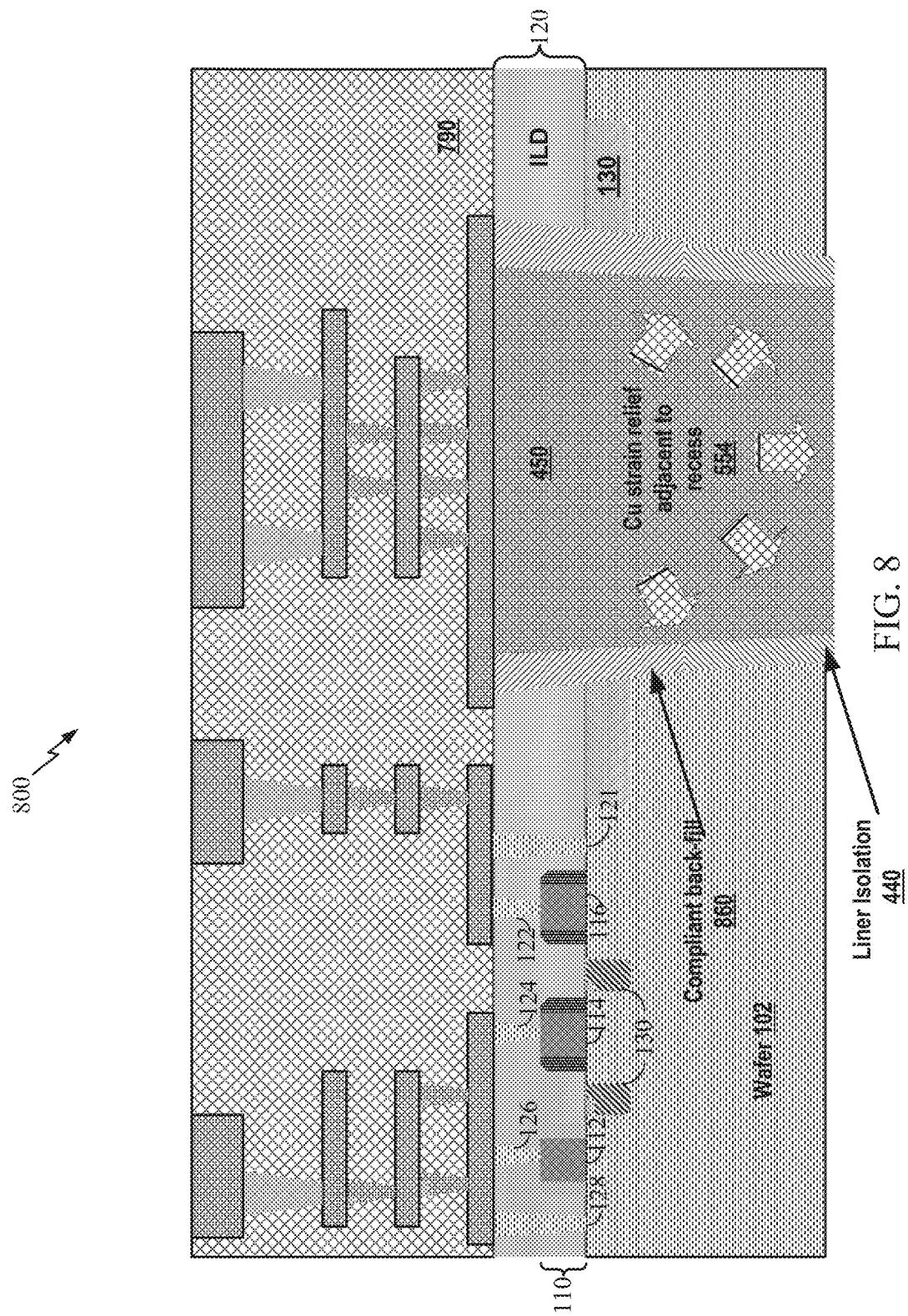
FIG. 8 shows a cross-sectional view illustrating the IC device of FIG. 7, including a through substrate via having a liner isolation layer and a back-fill material within a side-wall isolation recess according to one aspect of the disclosure.

FIG. 8 shows a cross-sectional view illustrating the IC device 800 of FIG. 7, including a TSV 450 having a liner isolation layer 440 and a compliant back-fill material 860 within a isolation recess 542 (e.g., a side-wall isolation recess) according to one aspect of the disclosure. In this aspect of the disclosure, the compliant back-fill material 860 may be a polyimide or other like material. In this configuration, the compliant back-fill material 860 absorbs compressive stress from the TSV 450 and/or the surrounding devices as indicated by the arrows 554.

Figure 9:
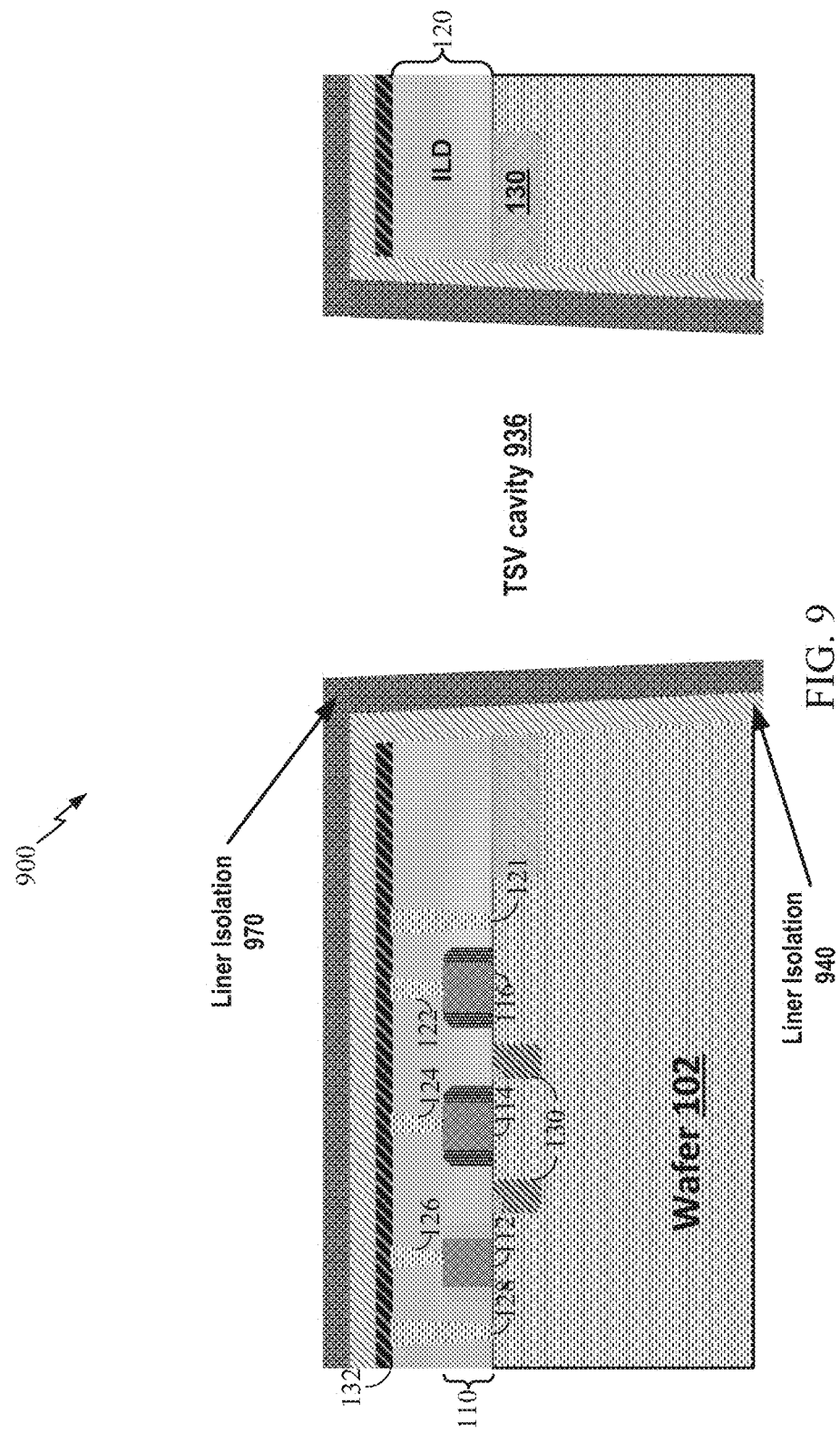
FIG. 9 shows a cross-sectional view illustrating the IC device of FIG. 1, illustrating first and second liner isolation layers according to one aspect of the disclosure.

FIG. 9 shows a cross-sectional view illustrating the IC device 900 of FIG. 1, with a first liner isolation layer 940 and a second liner isolation layer 970 according to one aspect of the disclosure. In one configuration, the first liner isolation layer 940 and the second liner isolation layer 970 are chemically distinct. Representatively, FIG. 9 illustrates a variation of the liner isolation deposition in which a multi-layer liner isolation is formed onto the polish stop layer 132 and the sidewalls of the TSV cavity 936. In this configuration, the multi-liner isolation layers may include an oxide, a nitride or other like dielectric material.

Figure 10:
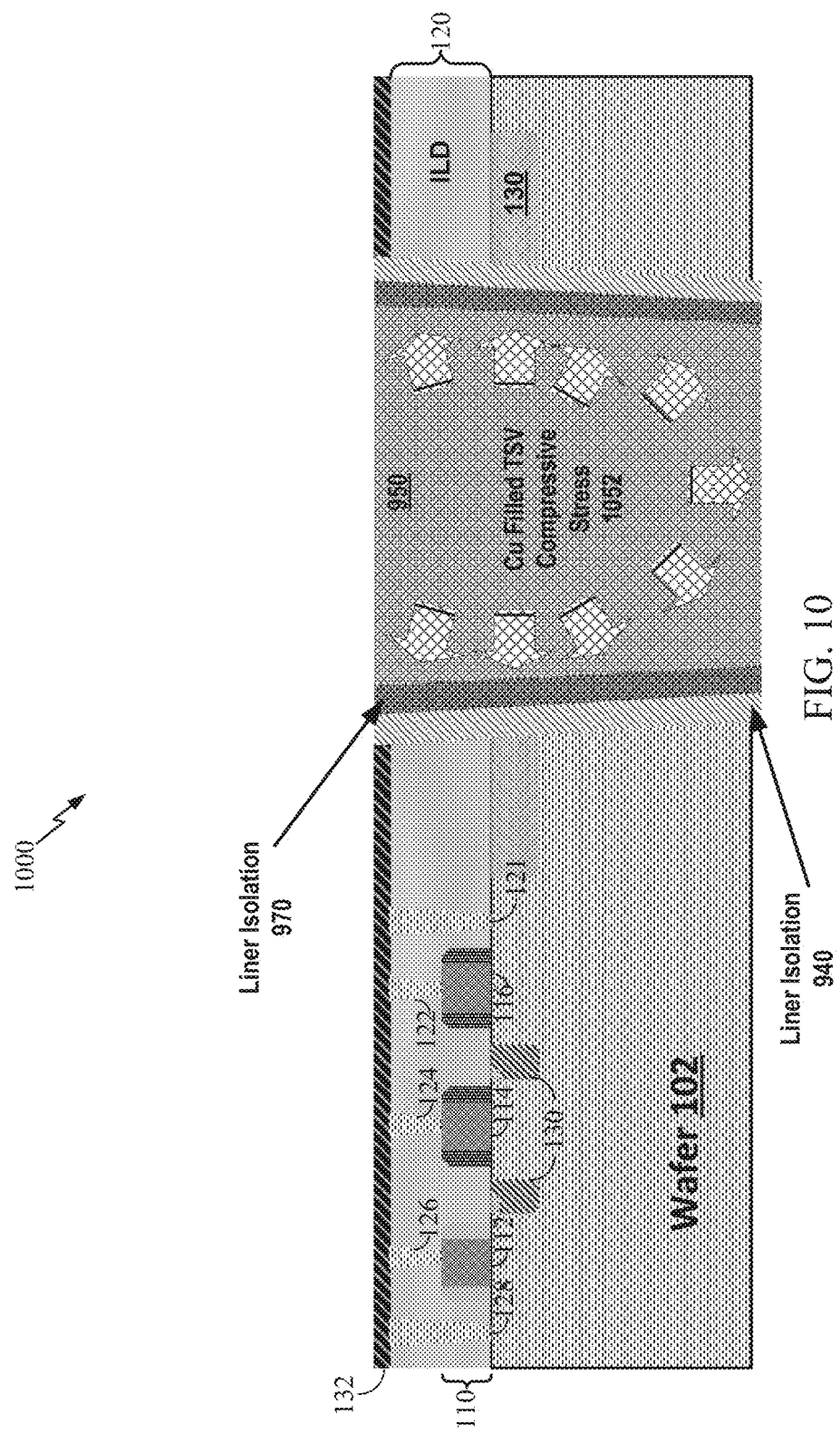
FIG. 10 shows a cross-sectional view illustrating the IC device of FIG. 9, illustrating a through substrate via (TSV) surrounded by the first and second liner isolation layers according to one aspect of the disclosure.

FIG. 10 shows a cross-sectional view illustrating the IC device 1000 of FIG. 9, with a through substrate via (TSV) 950 surrounded by the first liner isolation layer 940 and the second liner isolation layer 970 according to one aspect of the disclosure. As shown in FIG. 10, TSV fill and polish processes provide the TSV 950 including a multi-layer liner isolation (e.g., the first liner isolation layer 940 and the second liner isolation layer 970) on the TSV sidewalls. As shown in FIG. 10, the arrows 1052 illustrate compressive stress caused by the TSV 950 (e.g., a copper filled TSV).

Figure 11:
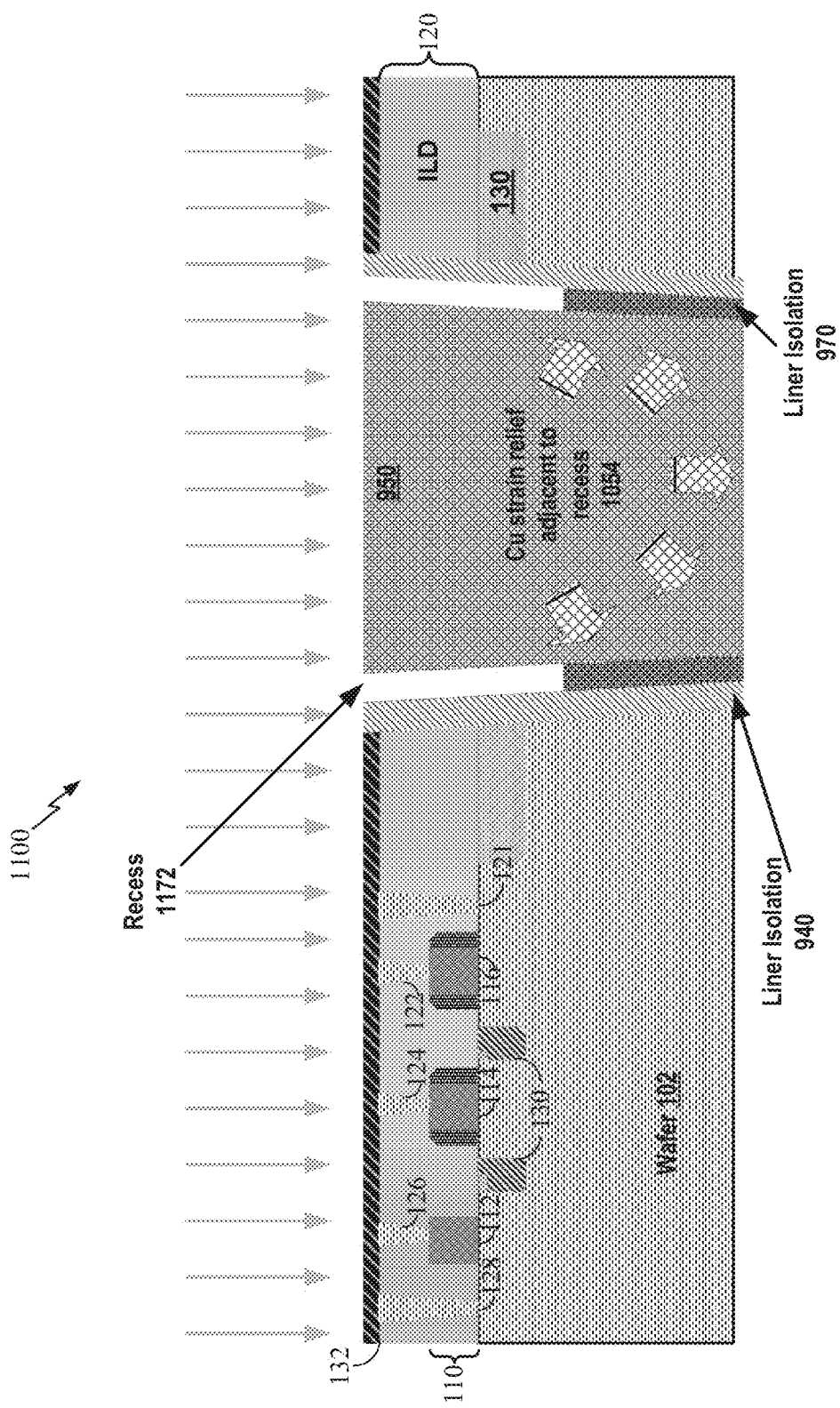
FIG. 11 shows a cross-sectional view illustrating the IC device of FIG. 10, including an isolation recess formed within the second liner isolation layer according to one aspect of the disclosure.

FIG. 11 shows a cross-sectional view illustrating the IC device 1100 of FIG. 10, including an isolation recess 1172 formed within the second liner isolation layer 970 according to one aspect of the disclosure. Representatively, a liner isolation recess etch is performed. In this configuration, the liner isolation recess etch is a chemically selective etch that only removes a portion of one of the two liner isolation layers 940/970. As shown in FIG. 11, the isolation recess 1172 may provide an additional isolation barrier between the TSV filler material and the silicon of the wafer 102.

Figure 12:
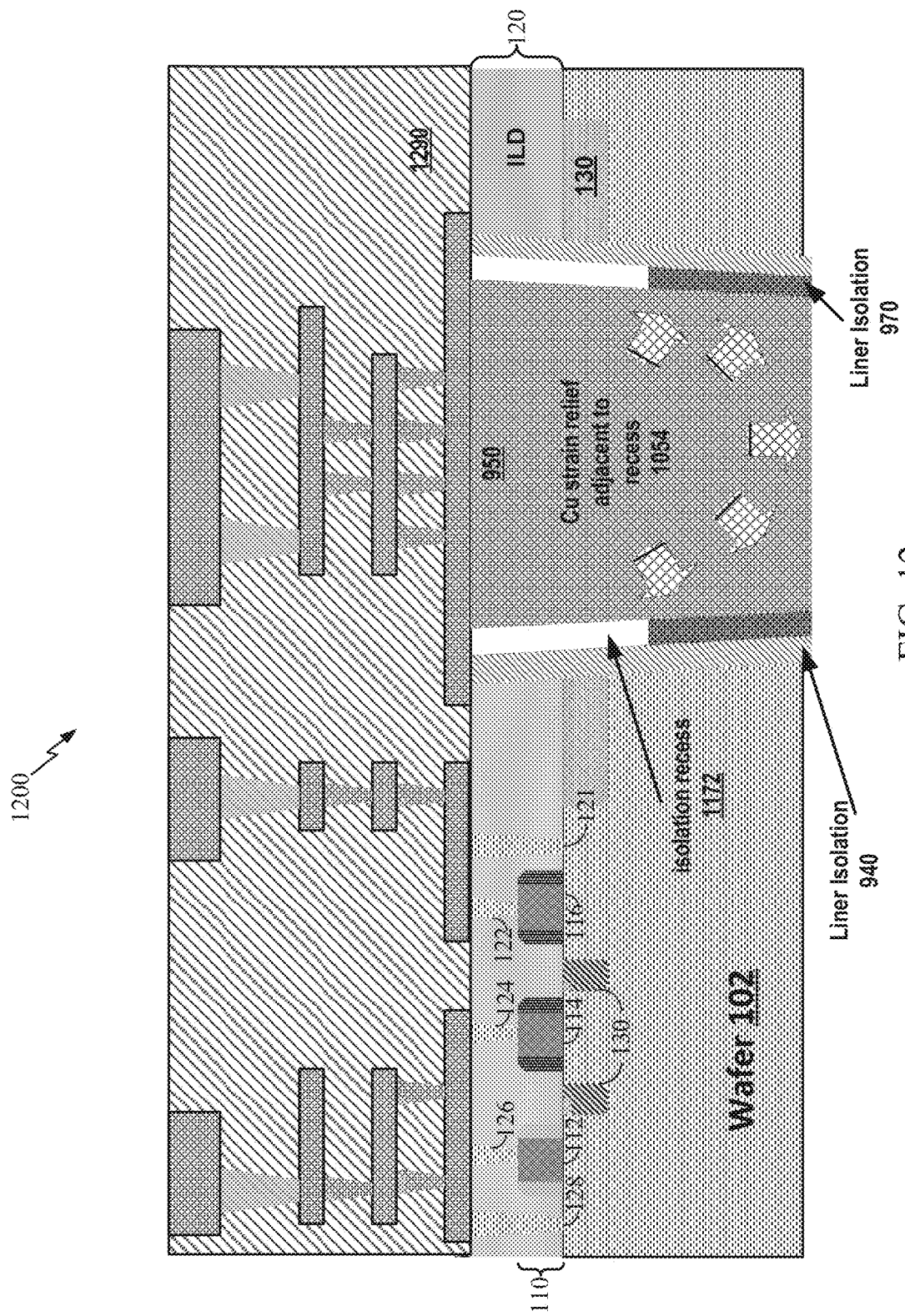
FIG. 12 shows a cross-sectional view illustrating the IC device of FIG. 11, following a back-end of line (BEOL) stack fabrication according to one aspect of the disclosure.

FIG. 12 shows a cross-sectional view illustrating the IC device 1200 of FIG. 11, following a back-end of line (BEOL) stack fabrication according to one aspect of the disclosure. Representatively, after TSV processing is complete, BEOL interconnect layers of a BEOL interconnect stack 1290 are fabricated on the silicon wafer 102 to complete the formation of the IC device 1200. In this configuration, the isolation recess 1172 provides strain relief for the TSV filler material to reduce and/or prevent the filler material from being pumped upwards and out of the TSV 950.

Figure 13:
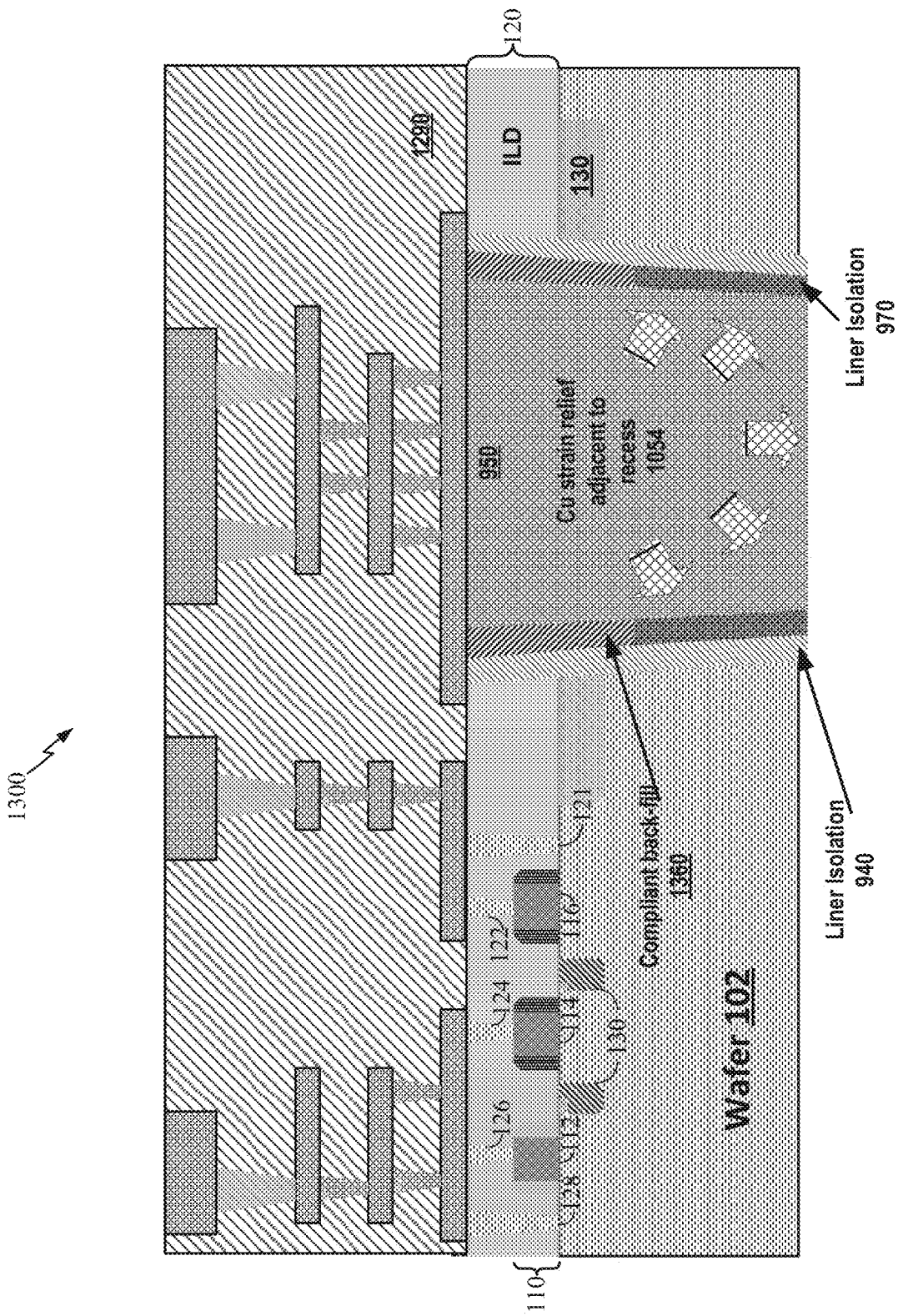
FIG. 13 shows a cross-sectional view illustrating the IC device of FIG. 12, including a back-fill material within an isolation recess of a multi-layer liner isolation according to one aspect of the disclosure.

FIG. 13 shows a cross-sectional view illustrating the IC device 1300 of FIG. 12, including a compliant back-fill material 1360 within an isolation recess of a multi-layer liner isolation (e.g., first liner isolation layer 940 and the second liner isolation layer 970) according to one aspect of the disclosure. As shown in FIG. 13, the TSV 950 includes a first liner isolation layer 940, a second liner isolation layer 970, and a compliant back-fill material 1360 within a side-wall isolation recess 1142 according to one aspect of the disclosure. In this aspect of the disclosure, the compliant back-fill material may be a polyimide or other like material. In this configuration, the compliant back-fill material 1360 absorbs compressive stress 1054 from the TSV 950 and/or the surrounding devices.

Figure 14:
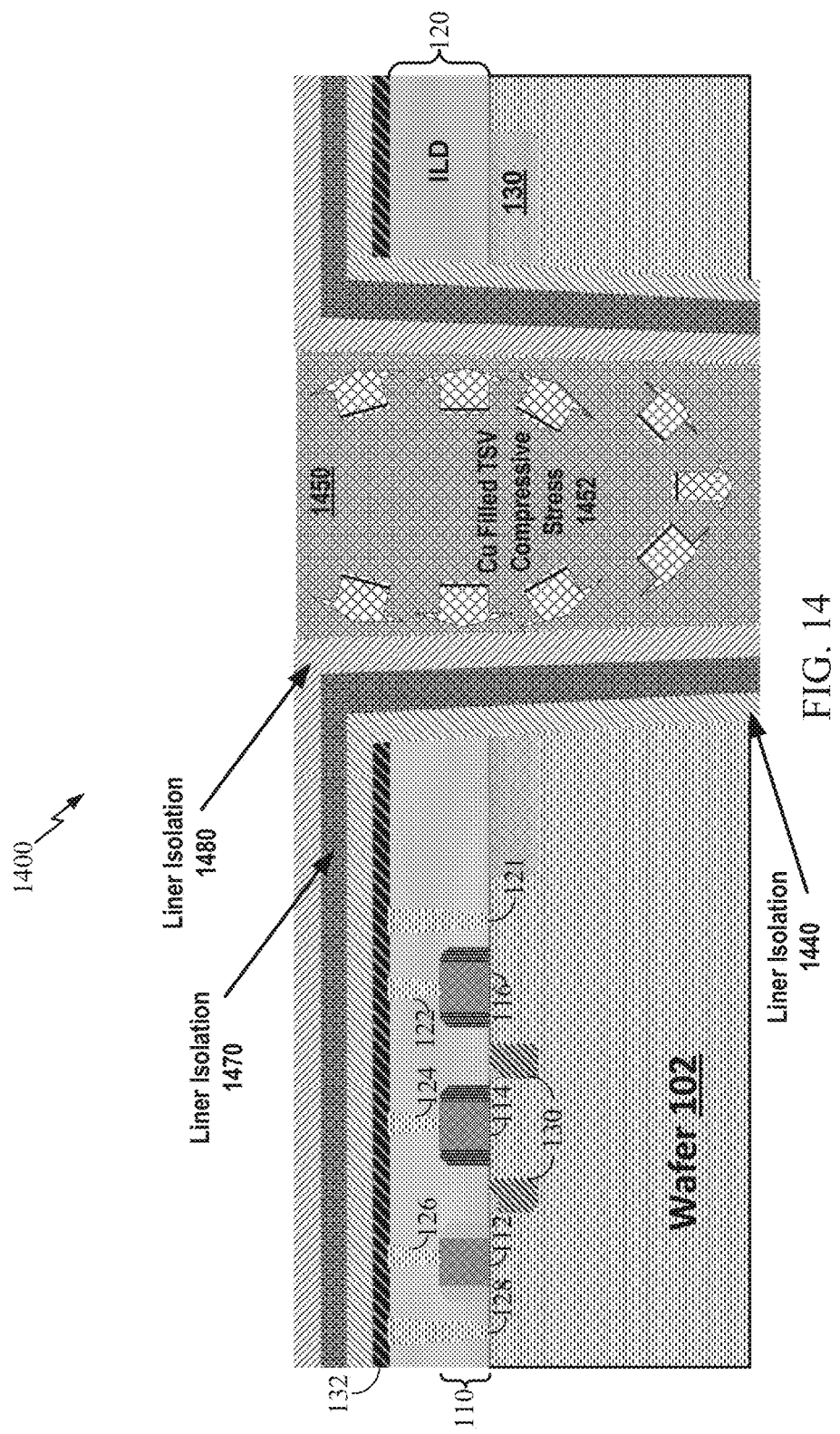
FIG. 14 shows a cross-sectional view illustrating an IC device of FIG. 9, including a through substrate via (TSV) surrounded by the first, second, and third liner isolation layers according to one aspect of the disclosure.

FIG. 14 shows a cross-sectional view illustrating the IC device 1400 of FIG. 9, including a through substrate via (TSV) 1450 surrounded by a multi-layer liner isolation including the first liner isolation layer 1440, the second liner isolation layer 1470, and third liner isolation layers 1480 according to one aspect of the disclosure. In one configuration, the first liner isolation layer 1440, the second liner isolation layer 1470, and the third liner isolation layer 1480 are chemically distinct. Representatively, FIG. 14 illustrates a variation of the liner isolation deposition in which a multi-layer liner isolation is formed onto the polish stop layer 132 and the sidewalls of the TSV 1450. As shown in FIG. 14, the arrows 1452 illustrate compressive stress caused by the TSV 1450 (e.g., a copper filled TSV). In this configuration, the multi-liner isolation layers may include an oxide, a nitride or other like dielectric material.

Figure 15:
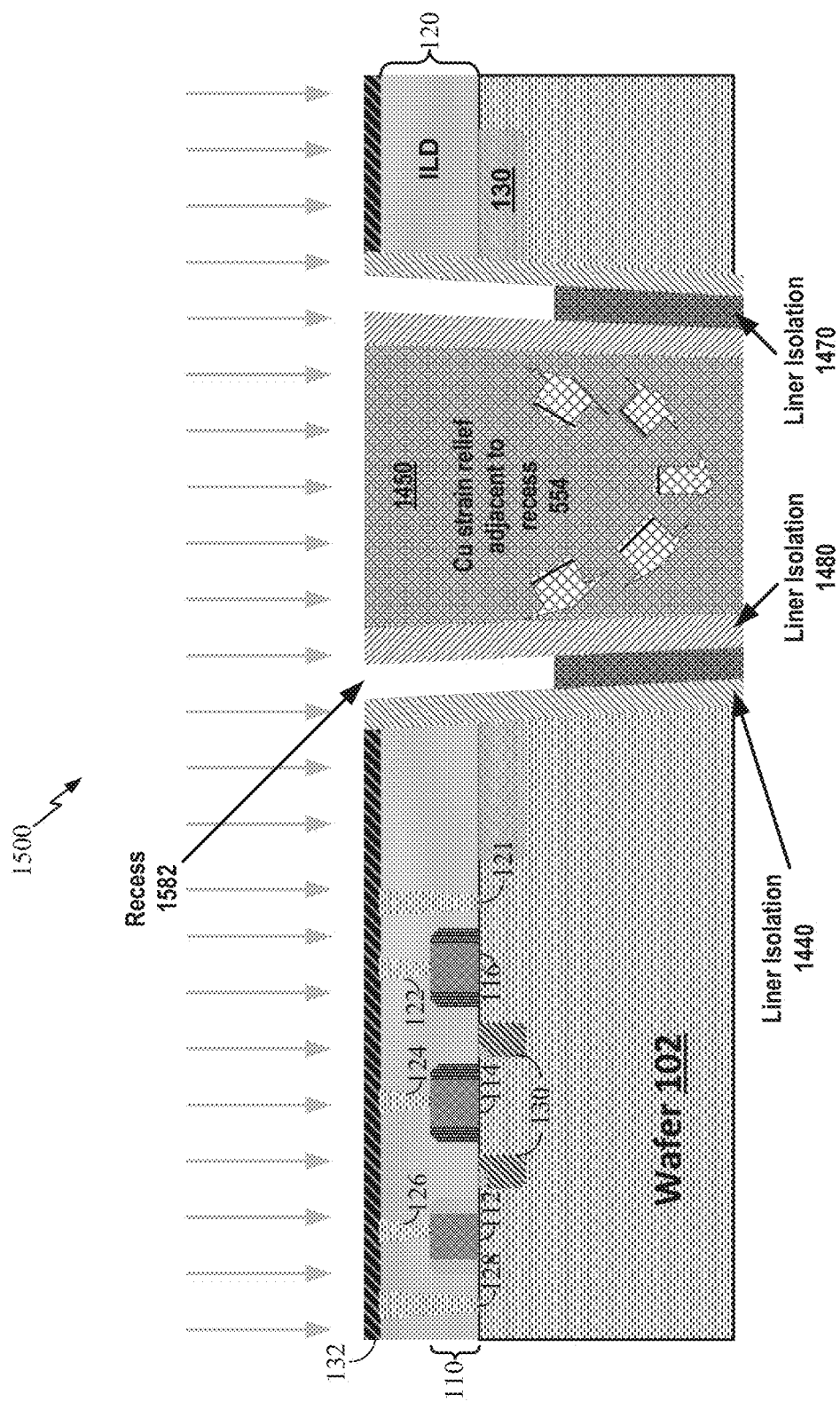
FIG. 15 shows a cross-sectional view illustrating the IC device of FIG. 14, including an isolation recess formed within the second liner isolation layer according to one aspect of the disclosure.

FIG. 15 shows a cross-sectional view illustrating the IC device 1500 of FIG. 14, including an isolation recess 1582 formed within the second liner isolation layer 1470 according to one aspect of the disclosure. Representatively, a liner isolation recess etch is performed. In this configuration, the liner isolation recess etch is a chemically selective etch that only removes a portion of one of the three liner isolation layers 1440/1470/1480. As shown in FIG. 15, the isolation recess 1582 may provide an additional isolation barrier between the TSV filler material and the material of the wafer 102. As shown in FIG. 15, compressive stress relief adjacent to the isolation recess 1582 is indicated by the arrows 1554.

Figure 16:
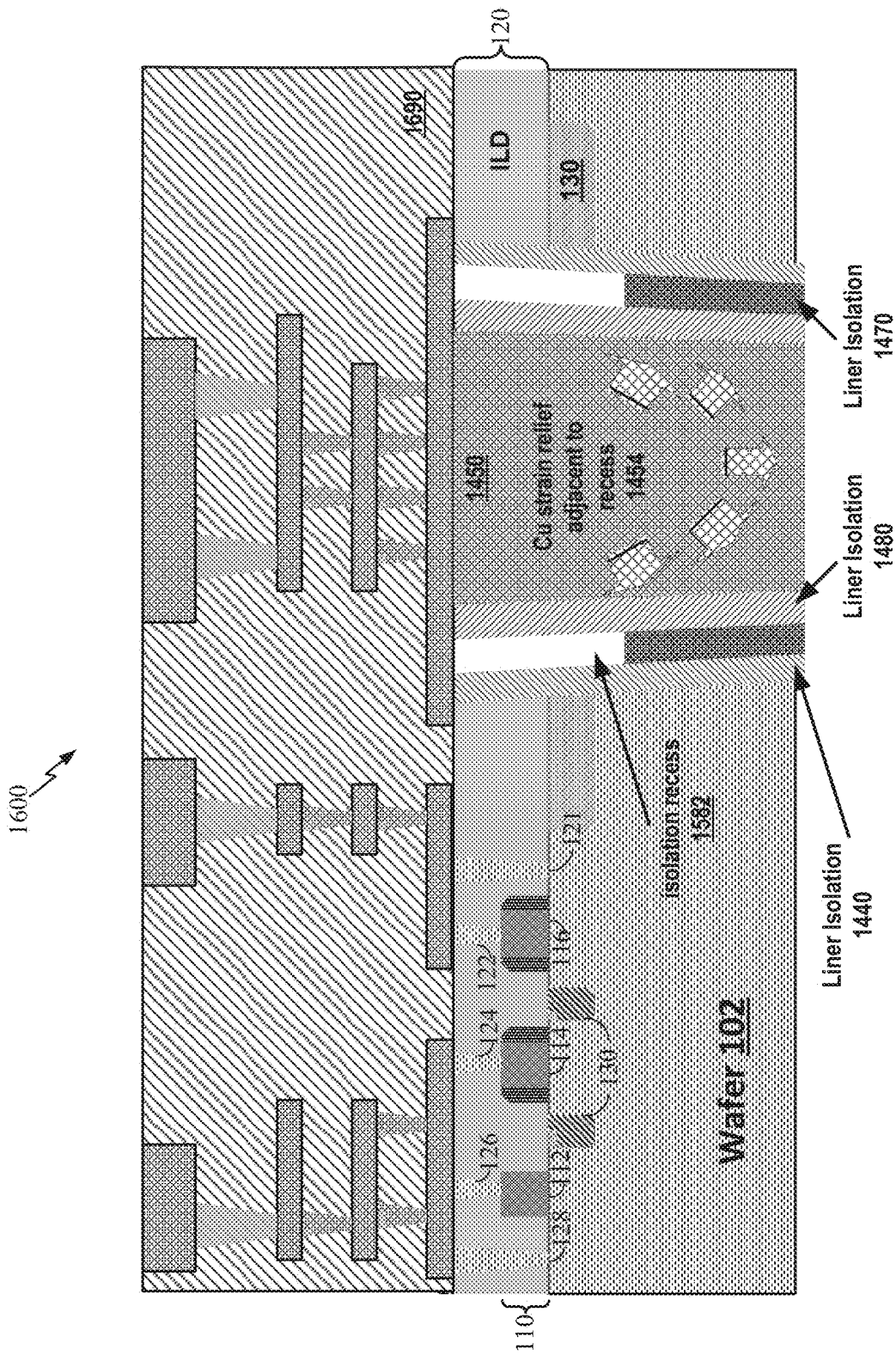
FIG. 16 shows a cross-sectional view illustrating the IC device of FIG. 15, following a back-end of line (BEOL) stack fabrication according to one aspect of the disclosure.

FIG. 16 shows a cross-sectional view illustrating the IC device 1600 of FIG. 15, following a back-end of line (BEOL) stack fabrication according to one aspect of the disclosure. Representatively, after TSV processing is complete, BEOL interconnect layers of a BEOL interconnect stack 1690 are fabricated on the wafer 102 to complete the formation of the IC device 1600. In this configuration, the isolation recess 1582 provides strain relief for the TSV filler material to reduce and/or prevent the filler material from being pumped upwards and out of the TSV 1450.

Figure 17:
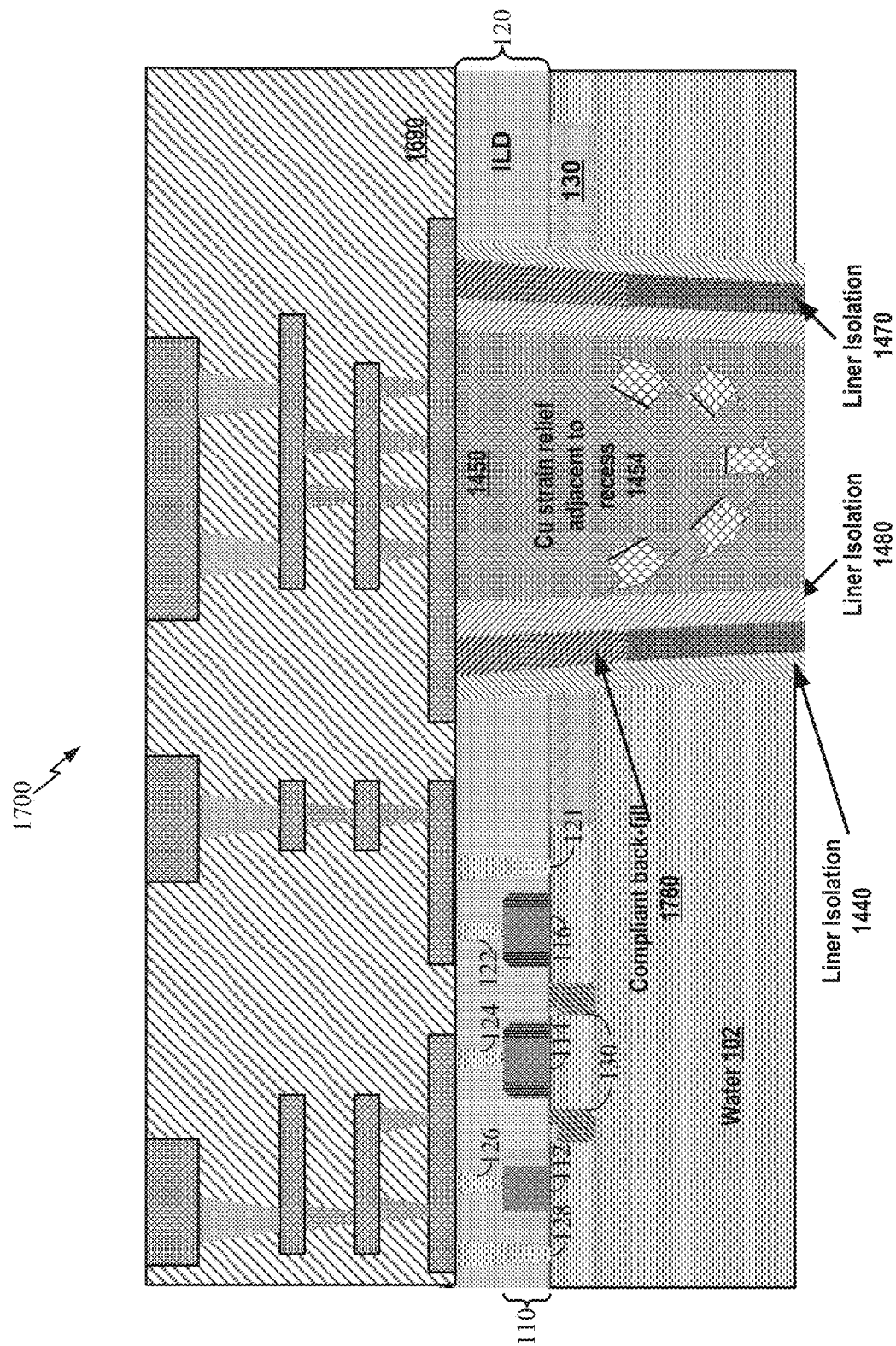
FIG. 17 shows a cross-sectional view illustrating the IC device of FIG. 16, including a back-fill material within an isolation recess of a multi-layer liner isolation according to one aspect of the disclosure.

FIG. 17 shows a cross-sectional view illustrating the IC device 1700 of FIG. 16, including a compliant back-fill material 1760 within an isolation recess of a multi-layer liner isolation (e.g., the first liner isolation layer 1440, the second liner isolation layer 1470, and the third liner isolation layer 1480) according to one aspect of the disclosure. As shown in FIG. 17, a TSV 1450 includes a first liner isolation layer 1440, a second liner isolation layer 1470, a third liner isolation layer 1480, and a compliant back-fill material 1760 within the isolation recess 1582 (FIG. 16) according to one aspect of the disclosure. In this aspect of the disclosure, the compliant back-fill material 1760 may be a polyimide or other like material. In this configuration, the compliant back-fill material 1760 absorbs compressive stress 1454 from the TSV 1450 and/or the surrounding devices.

Figure 18:
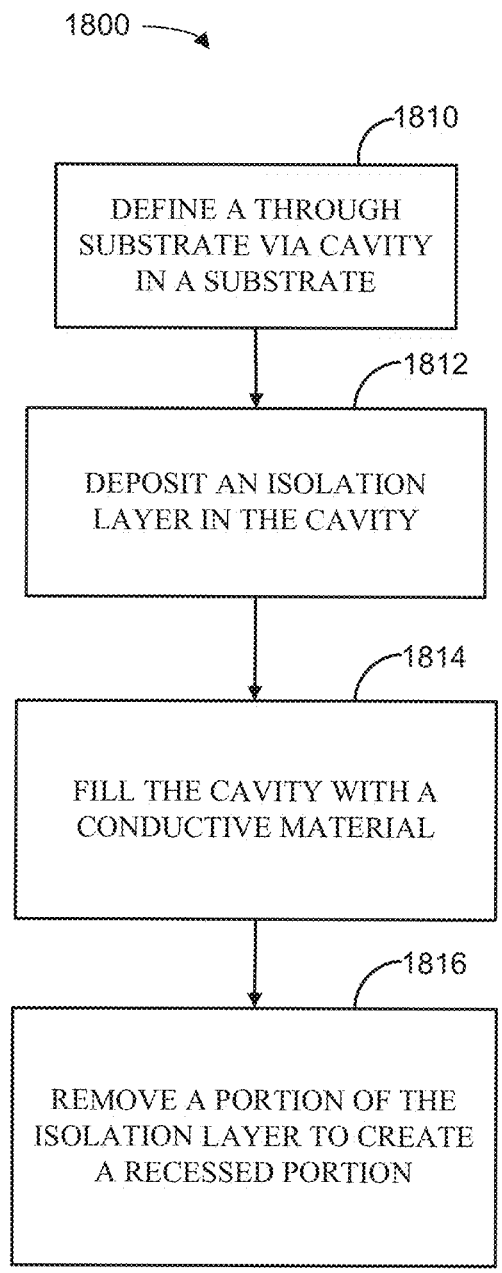
FIG. 18 is a block diagram illustrating a method for forming a through substrate vias (TSVs) including one or more liner isolation layers and an isolation recess on a sidewall of the TSV, according to one aspect of the disclosure.

FIG. 18 is a block diagram illustrating a method 1800 for forming a through substrate via (TSV) including one or more liner isolation layers and an isolation recess on a sidewall of the TSV, according to one aspect of the disclosure. At block 1810, a TSV cavity 236/936 is defined through a substrate, for example, as shown in FIGS. 2, 3, and 9. Although the present description has been primarily with respect to a silicon substrate, other substrate materials are also contemplated. At block 1812, a liner isolation layer is deposited in the TSV cavity and on a polish stop layer, for example, as shown in FIGS. 3, 9, and 14. At block 1814, the through substrate via 450/1050/1450 is filled with a conductive material, for example, as shown in FIGS. 4, 10, and 14. Although the present description has been primarily with respect to a copper filler, other filler materials are also contemplated. At block 1816, the liner isolation layer is etched to create a recessed portion. For example, as shown in FIGS. 5, 11 and 15, etching of the liner isolation layer leaves a liner isolation recess 542/1172/1582 on a sidewall of the TSV 450/950/1450.

Figure 19:
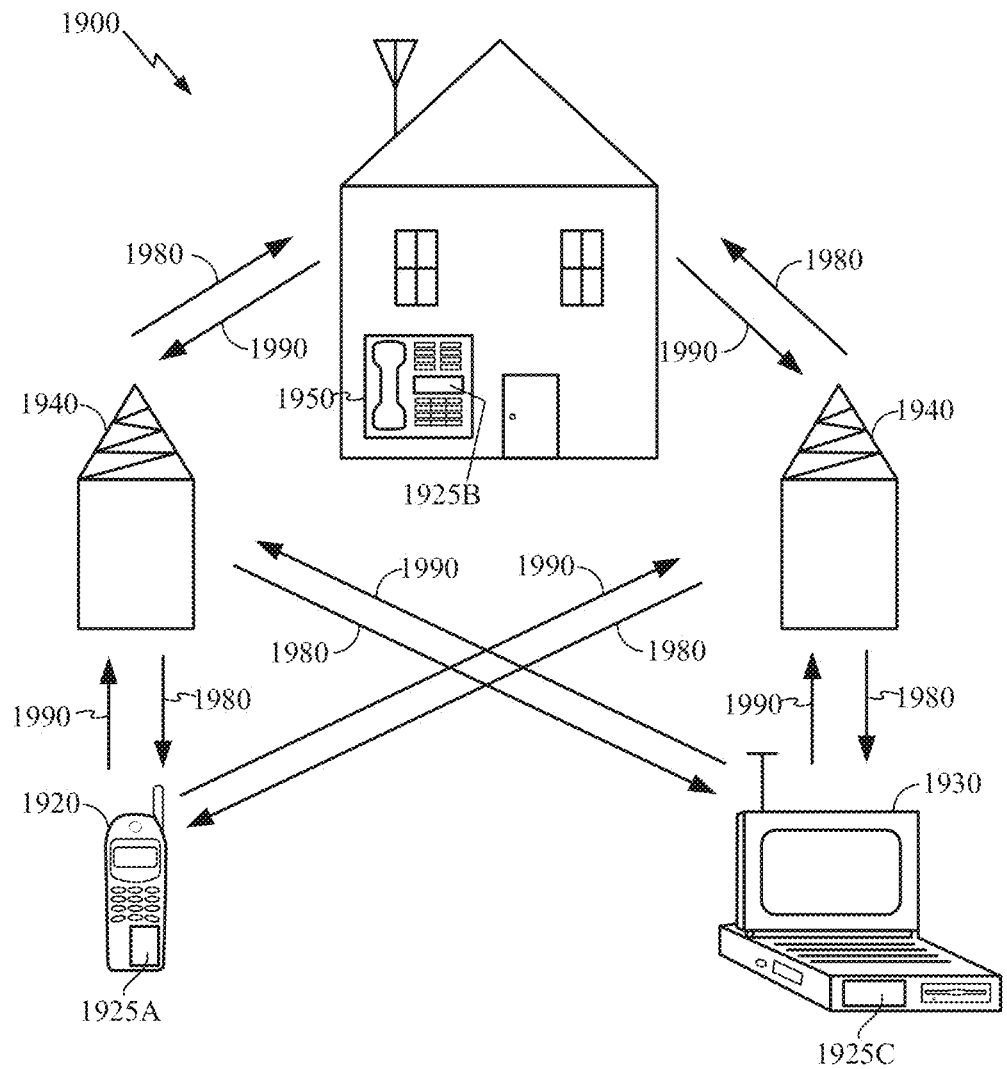
FIG. 19 is a block diagram showing a wireless communication system in which a configuration of the disclosure may be advantageously employed.

FIG. 19 is a block diagram showing an exemplary wireless communication system 1900 in which a configuration of the disclosure may be advantageously employed. For purposes of illustration, FIG. 19 shows three remote units 1920, 1930, and 1950 and two base stations 1940. It will be recognized that wireless communication systems may have many more remote units and base stations. Remote units 1920, 1930, and 1950 include IC devices 1925A, 1925C and 1925B, that include the disclosed through substrate via (TSV) surrounded by a liner isolation layer. It will be recognized that any device containing an IC may also include a TSV surrounded by the liner isolation layer disclosed here, including the base stations, switching devices, and network equipment. FIG. 19 shows forward link signals 1980 from the base station 1940 to the remote units 1920, 1930, and 1950 and reverse link signals 1990 from the remote units 1920, 1930, and 1950 to base stations 1940.

In FIG. 19, remote unit 1920 is shown as a mobile telephone, remote unit 1930 is shown as a portable computer, and remote unit 1950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 19 illustrates remote units according to the teachings of the disclosure, the disclosure is not limited to these exemplary illustrated units. Aspects of the present disclosure may be suitably employed in any device which includes a TSV surrounded by a liner isolation layer.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "top" and "bottom", "above" and "below" are used with respect to a substrate or electronic device. Of course, if the substrate or electronic device is inverted, top becomes bottom, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of fabricating a through substrate via, comprising:
    defining a through substrate via cavity in a substrate;
    depositing a first isolation layer in the cavity, the first isolation layer having a first surface on a surface of the substrate and on a surface of a shallow trench isolation region and a second surface opposite the first surface, the first isolation layer extending completely through the substrate and the shallow trench isolation region;
    filling the cavity with a conductive material; and
    depositing a second isolation layer surrounding the through substrate via, the second isolation layer comprising a recessed portion including an empty space near an active portion of the substrate to relieve stress from the conductive material and a dielectric portion, the recessed portion in close proximity to the active portion of the substrate, a second surface of the first isolation layer on the second isolation layer, the recessed portion defined between the first isolation layer, the dielectric portion and the conductive material.

2. The method of fabricating the through substrate via of claim 1, further comprising filling the recessed portion with a compliant back-fill material.

3. The method of fabricating the through substrate via of claim 1, further comprising:
    depositing at least one additional isolation layer in the cavity before filling the cavity.

4. The method of fabricating the through substrate via of claim 3, in which the at least one additional isolation layer comprises a plurality of additional isolation layers.

5. The method of fabricating the through substrate via of claim 4, further comprising:
    selectively removing a portion of at least one of the plurality of additional isolation layers after filling the cavity to create the recessed portion.

6. The method of fabricating the through substrate via of claim 1, in which the second isolation layer is formed from a material selected from a group consisting of unfluorinated silica glass (USG), tetraethyl orthosilicate (TEOS), silicon oxide, silicon nitride, and an organic insulator.

7. The method of fabricating the through substrate via of claim 1, further comprising:
performing a chemically selective etch to remove a portion of the second isolation layer to create the recessed portion.

8. The method of fabricating the through substrate via of claim 1, further comprising:
incorporating the through substrate via including the second isolation layer having the recessed portion within a semiconductor die.

9. The method of fabricating the through substrate via of claim 8, further comprising:
integrating the semiconductor die into a music player, a video player, an entertainment unit, a navigation device, a communications device, a personal digital assistant (PDA), a fixed location data unit, and/or a computer.

10. A method of fabricating a through substrate via, comprising:
a step of defining a through substrate via cavity in a substrate;
a step of depositing a first isolation layer in the cavity, the first isolation layer having a first surface on a surface of the substrate and on a surface of a shallow trench isolation region and a second surface opposite the first surface, the first isolation layer extending completely through the substrate and the shallow trench isolation region;
a step of filling the cavity with a conductive material; and
a step of depositing a second isolation layer surrounding the through substrate via, the second isolation layer comprising a recessed portion including an empty space near an active portion of the substrate to relieve stress from the conductive material and a dielectric portion, the recessed portion in close proximity to the active portion of the substrate, a second surface of the first isolation layer on the second isolation layer, the recessed portion defined between the first isolation layer, the dielectric portion and the conductive material.

11. The method of fabricating the through substrate via of claim 10, further comprising a step of filling the recessed portion with a compliant back-fill material.

12. The method of fabricating the through substrate via of claim 10, further comprising:
a step of depositing at least one additional isolation layer in the cavity before filling the cavity.

13. The method of fabricating the through substrate via of claim 12, in which the at least one additional isolation layer comprises a plurality of additional isolation layers.

14. The method of fabricating the through substrate via of claim 13, further comprising:
a step of selectively removing a portion of at least one of the plurality of additional isolation layers after filling the cavity to create the recessed portion.

15. The method of fabricating the through substrate via of claim 10, further comprising a step of forming the second isolation layer from a material selected from a group consisting of unfluorinated silica glass (USG), tetraethyl orthosilicate (TEOS), silicon oxide, silicon nitride, and an organic insulator.

16. The method of fabricating the through substrate via of claim 10, further comprising:
a step of performing a chemically selective etch to remove a portion of the second isolation layer to create the recessed portion.

17. The method of fabricating the through substrate via of claim 10, further comprising the step of incorporating the through substrate via including the second isolation layer having the recessed portion within a semiconductor die.

18. The method of fabricating the through substrate via of claim 17, further comprising the step of incorporating the semiconductor die into a music player, a video player, an entertainment unit, a navigation device, a communications device, a personal digital assistant (PDA), a fixed location data unit, and/or a computer.

* * * * *